United States Patent
Inamori et al.

(10) Patent No.: US 7,421,255 B2
(45) Date of Patent: Sep. 2, 2008

(54) TRANSMISSION APPARATUS AND MOBILE COMMUNICATION TERMINAL APPARATUS

(75) Inventors: Masahiko Inamori, Ibaraki (JP); Tsunehiro Takagi, Nagaokakyo (JP); Masao Nakayama, Ritto (JP); Haruhiko Koizumi, Suita (JP); Kaname Motoyoshi, Nishinomiya (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 555 days.

(21) Appl. No.: 11/188,865

(22) Filed: Jul. 26, 2005

(65) Prior Publication Data

US 2006/0057982 A1   Mar. 16, 2006

(30) Foreign Application Priority Data

Sep. 12, 2004   (JP) ............................. 2004-357267
Sep. 16, 2004   (JP) ............................. 2004-270206

(51) Int. Cl.
   *H04Q 11/12* (2006.01)
(52) U.S. Cl. ................ 455/127.2; 375/295; 330/284
(58) Field of Classification Search .............. 455/115.1, 455/115.3, 127.1, 127.2, 127.3, 522; 375/295, 375/296, 297; 330/277, 278, 284, 295, 307
See application file for complete search history.

(56) References Cited

U.S. PATENT DOCUMENTS

| 4,890,077 A |   | 12/1989 | Sun |
| 5,627,857 A | * | 5/1997 | Wilson ................... 455/127.2 |
| 6,081,701 A | * | 6/2000 | Norimatsu ............... 455/232.1 |
| 6,847,807 B1 | * | 1/2005 | Fujiki ......................... 375/295 |

FOREIGN PATENT DOCUMENTS

JP   2000-165311 A   6/2000

* cited by examiner

*Primary Examiner*—Quochien B. Vuong
(74) *Attorney, Agent, or Firm*—McDermott Will & Emery LLP

(57) ABSTRACT

An output level of a transmission apparatus 1 is determined, depending on an attenuation amount of an attenuator 30, a gain of one of a high output level amplification section 17 and a low output level amplification section 18, which is used. A reference voltage Vref(H) is discontinuously changed. Depending on the magnitude of the reference voltage Vref (H), it is determined which of the amplification sections 17, 18 is used, and the attenuation amount of the attenuator 30 and the gain of the amplification section 17, 18 are also determined. When the magnitude of the reference voltage Vref(H) is changed, a sum of the attenuation amount of the attenuator 30 and a gain change amount of a switch amplification section 19 is substantially zero.

13 Claims, 14 Drawing Sheets

F I G. 8
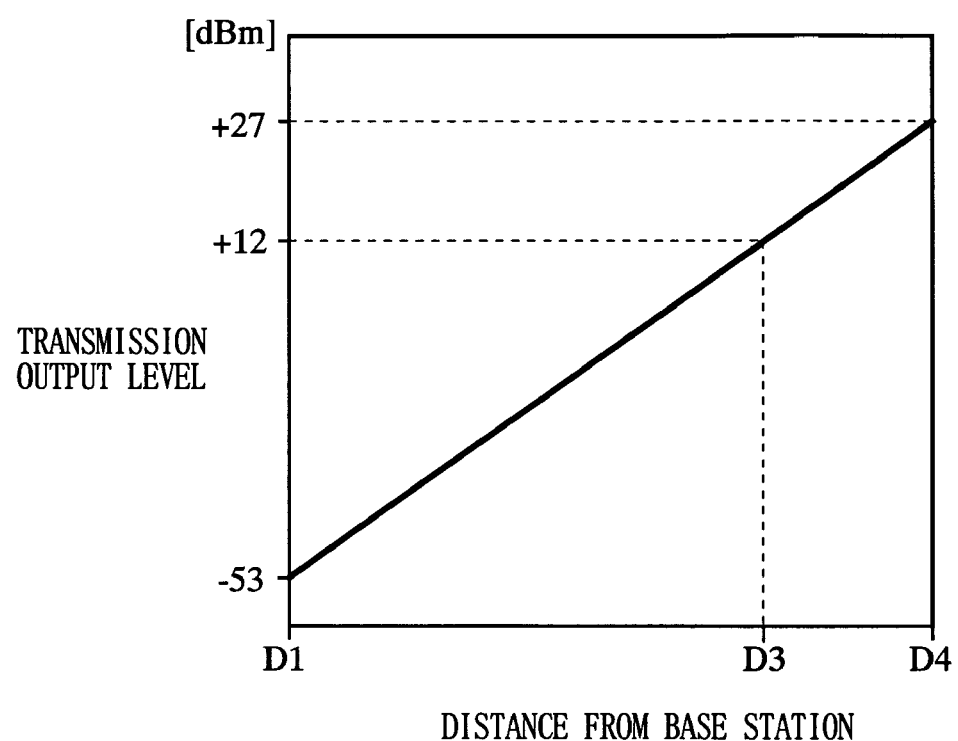

| | R1 [kΩ] | R2 [kΩ] | FIRST MODE Vref_L(H)=2.5V | | SECOND MODE Vref_H(H)=2.7V | |
|---|---|---|---|---|---|---|
| | | | dV [V] | dAtt [dB] | dV [V] | dAtt [dB] |
| ATTENUATOR 30a | 1 | — | ±0.075 | ±6.00 | ±0.081 | ±6.48 |
| ATTENUATOR 30b | 1 | 1 | ±0.0375 | ±3.00 | ±0.0405 | ±3.24 |

(b)

| | R1 [kΩ] | R2 [kΩ] | Vref_L(H)=0V | | Vref_H(H)=2.7V | |
|---|---|---|---|---|---|---|
| ATTENUATOR 30b | 12.5 | 1 | ±0 | ±0 | 0.006 | ±0.48 |

F I G. 1 1
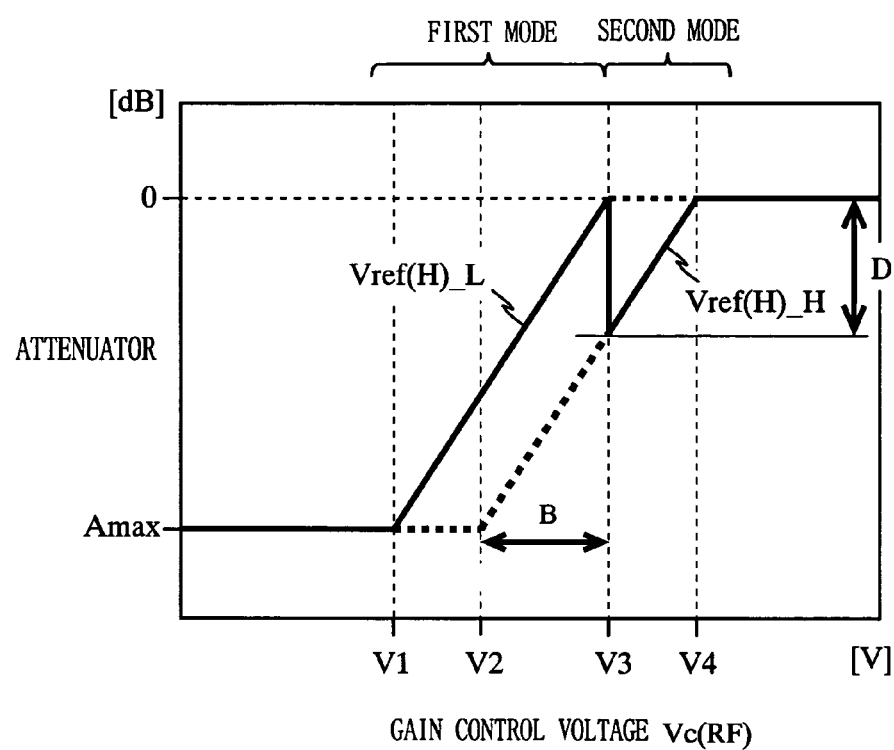

TRANSMISSION APPARATUS AND MOBILE COMMUNICATION TERMINAL APPARATUS

BACKGROUND OF THE INVENTION

1. Field of the Invention

The present invention relates to a mobile communication terminal apparatus and a transmission apparatus. More particularly, the present invention relates to a mobile communication terminal apparatus and a transmission apparatus which employ a communication method which requires adjustment of a transmission output level.

2. Description of the Background Art

In digital mobile communication techniques, such as WCDMA (Wideband Code Division Multiple Access) and the like, a transmission output level of each mobile telephone terminal apparatus needs to be adjusted so that a base station can receive a signal having a constant strength irrespective of a distance between the base station and the mobile telephone terminal apparatus.

FIG. 12 is a diagram illustrating a base station 200 having a cell range 210 having a radius of about several tens of kilometers (e.g., about 30 km), and mobile telephone terminal apparatuses 100. The transmission output level of the mobile telephone terminal apparatus 100 needs to be increased with an increase in the distance from the base station 200 so that the base station 200 receives a signal having a constant strength when the communication environment is the same at any place within the cell range 210.

In order to achieve such a transmission output control, the mobile telephone terminal apparatus 100 needs to be equipped with a gain adjuster, such as a power amplifier, an attenuator or the like. In communication techniques, such as WCDMA and the like, since the dynamic range is broad, the mobile telephone terminal apparatus 100 needs to be equipped with a plurality of gain adjusters.

FIG. 13 is a block diagram illustrating an exemplary structure of a conventional mobile telephone terminal apparatus 100 which is disclosed in Japanese Patent Laid-Open Publication No. 2000-165311. The mobile telephone terminal apparatus 100 comprises an amplification section 113 including a power amplifier 102 and a power amplifier 103, a duplexer 104, an antenna 105, a low noise amplifier 112, a control logic section 111, and switches 106 to 110. In the case of transmission, an audio signal input to an input section 101 is amplified in the amplification section 113, and the resultant signal is transmitted via the duplexer 104 and from the antenna 105 to the base station 200.

The power amplifiers 102 and 103 are each used while the magnitude of a gain thereof is fixed. The magnitude of a gain of the amplification section 113 is determined, depending on which of the power amplifiers 102 and 103 is used. The power amplifiers 102 and 103 are selected by switching connections of the switches 106 to 110. An operating state of the amplification section 113 can be switched between the case where none of the power amplifiers 102 and 103 is used, the case where only the power amplifier 102 is used, and the case where both the power amplifier 102 and the power amplifier 103 are used.

In addition to the mobile telephone terminal apparatus 100 of FIG. 13, another mobile telephone terminal apparatus may be used in which power amplifiers having different gains are connected in parallel, and among them, a power amplifier to be used is selected, depending on the transmission output level.

In order to control the transmission output level within a broad range of as large as 80 dB so as to meet a communication standard, an attenuator or a variable gain amplifier, such as, for example, those described in U.S. Pat. No. 4,890,077, may be provided preceding the input section 101.

In this case, a gain which is largely and discontinuously changed by switching the power amplifiers 102 and 103 can be combined with a gain of an attenuator or the like which can be adjusted to any magnitude within a gain width of, for example, 40 dB, thereby obtaining any gain within a range of as large as 80 dB. Hereinafter, switching of the power amplifiers 102 and 103 is referred to as operation switching (consumed current switching).

A control section, such as the control logic section of FIG. 13 or the like, determines a target value of the transmission output level based on a strength of a received signal, compares the target value with an actual transmission output level, and based on a result of comparison, determines a gain to be adjusted, thereby controlling a gain of an amplifier or an attenuator. By such a feedback control, the transmission output level is adjusted, depending on a communication situation.

In order to change the transmission output level continuously, a gain of the whole circuit needs to be changed continuously. Therefore, when operation switching is performed, the gains of the attenuator and the like as well as the amplification section 113 need to be adjusted so that the gain of the whole circuit is not changed between immediately before and immediately after switching.

In order that the gain of the whole circuit is not changed between immediately before and immediately after switching, the switches 108 to 110 included in the amplification section 113 of FIG. 13 need to be controlled with the same timing. Further, the amount of attenuation of the attenuator and the like needs to be adjusted with the same timing as that of control of the switches 108 to 110 so that a gain which is largely changed in the amplification section 113 due to operation switching is canceled.

However, the control timings of the power amplifier and the attenuator may be deviated from each other due to a time delay of the feedback control or the like. Particularly, in the case of operation switching in the amplification section 113, a disturbance occurs in the transmission output level as illustrated in FIG. 14. More specifically, during operation switching, for example, instantaneously, a certain power amplifier is in a post-operation switching state, while another power amplifier or an attenuator is in a pre-operation switching state. At this instant, the gain of the whole circuit is deviated from a predetermine value, resulting in a disturbance in the transmission output level. Note that, in FIG. 14, it is assumed that operation switching is performed when the distance between the base station and the mobile telephone terminal apparatus is D3 (where the transmission output level is set to be 12 dBm).

In conventional mobile telephone terminal apparatuses, there are a number of types of voltages to be adjusted for adjustment of a gain. Therefore, the adjustment of each gain adjuster is complicated when a sudden change in power source voltage or a variation in set voltage occurs. Particularly when operation switching is performed, the attenuation amount of the attenuator needs to be largely changed. Therefore, when a sudden change in power source voltage occurs, the gain cannot be adjusted quickly to a desired value, so that a disturbance occurs in the output until the desired value is obtained.

When the transmission output level is disturbed, the strength of a received signal of the base station 200 is deviated from a standard value, so that a level difference occurs between adjacent channels, leading to a deterioration in audio quality, such as, for example, a disturbance occurs in an audio signal. In the case of actual communication, a communication situation is changed from moment to moment, such as the location of the mobile telephone terminal apparatus is changed; the mobile telephone terminal apparatus enters behind a building; or the like. Therefore, the operation switching of the amplification section 113 is frequently performed. Therefore, the disturbance of the transmission output level which occurs during operation switching needs to be suppressed in order to improve audio quality.

SUMMARY OF THE INVENTION

Therefore, an object of the present invention is to provide a mobile telephone terminal apparatus in which a disturbance which is likely to occur during operation switching of the amplification section 113 is reduced, and a desired transmission output level is quickly obtained even when a power source voltage is suddenly changed. Another object of the present invention is to provide a simple control for obtaining a desired transmission output level and a small-size mobile telephone terminal apparatus.

According to the present invention, a transmission apparatus of continuously adjusting a magnitude of a transmission output level by changing a combination of gains of a plurality of gain adjusters, comprises a first one of the plurality of gain adjusters of receiving a supply of a first control voltage and discontinuously changing the gain thereof, depending on the first control voltage which is discontinuously changed, and a second one of the plurality of gain adjusters connected in series to the first gain adjuster, of receiving a supply of the first control voltage and a second control voltage and continuously changing the gain thereof, depending on the second control voltage which is continuously changed. A sum of gain change amounts of the first and second gain adjusters due to the discontinuous change in the first control voltage is substantially zero when the second control voltage is constantly maintained at a predetermined magnitude.

The first gain adjuster may include a plurality of amplification sections each having one or more amplifiers. Each of the plurality of amplification sections may perform amplification when the first control voltage has a predetermined magnitude which differs between each of the plurality of amplification sections, and may not perform amplification when the first control voltage has a magnitude other than the predetermined magnitude.

The first control voltage may be switched between a first magnitude and a second magnitude. The first gain adjuster may include a first amplification section of receiving a supply of the first control voltage, and performing amplification when the first control voltage has the first magnitude and not performing amplification when the first control voltage has the second magnitude, and a second amplification section of receiving a supply of the first control voltage and a third control voltage maintained at a constant magnitude, and performing amplification when the first control voltage has the second magnitude and not performing amplification when the first control voltage has the first magnitude. The first amplification section and the second amplification section may each include one or more amplifiers.

The one or more amplifiers included in the first and second amplification sections may each include a bipolar transistor. A base voltage of the bipolar transistor included in the first amplification section may be determined, depending on the first control voltage. A base voltage of the bipolar transistor included in the second amplification section may be determined, depending on the first control voltage and the third control voltage.

By switching the first control voltage from the first magnitude to the second magnitude, the base voltage of the bipolar transistor included in the first amplification section may be switched from a value of no less than an operational threshold thereof to a value of less than the operational threshold, and the base voltage of the bipolar transistor included in the second amplification section may be switched from a value of less than an operational threshold thereof to a value of no less than the operational threshold.

The bipolar transistors included in the first and second amplification sections may be formed on the same semiconductor substrate in the same manufacturing process.

The transmission apparatus of the present invention may comprise a voltage adjusting circuit of changing the first control voltage supplied to the second amplification section, depending on the magnitude thereof, and supplying the resultant first control voltage to an amplifier included in the second amplification section. The voltage adjusting circuit may include a bipolar transistor of operating when the first control voltage has a predetermined magnitude and not operating when the first control voltage has a magnitude other than the predetermined magnitude.

The second gain adjuster may include a variable resistance section of changing a resistance, depending on the first and second control voltages. The variable resistance section may have one or more field effect transistors, and a potential difference between a gate and a source of the field effect transistor is determined, depending on the first and second control voltages.

The variable resistance section may include a voltage divider of dividing the first control voltage and supplying the resultant divided voltage to the field effect transistor.

The second magnitude of the first control voltage may be zero.

According to the present invention, a mobile telephone terminal apparatus comprises a transmission section of continuously adjusting a magnitude of a transmission output level by changing a combination of gains of a plurality of gain adjusters. The transmission section comprises a first one of the plurality of gain adjusters of receiving a supply of a first control voltage and discontinuously changing the gain thereof, depending on the first control voltage which is discontinuously changed, and a second one of the plurality of gain adjusters connected in series to the first gain adjuster, of receiving a supply of the first control voltage and a second control voltage and continuously changing the gain thereof, depending on the second control voltage which is continuously changed. A sum of gain change amounts of the first and second gain adjusters due to the discontinuous change in the first control voltage is substantially zero when the second control voltage is constantly maintained at a predetermined magnitude.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram illustrating transmission output level characteristics of the mobile telephone terminal apparatus of the first embodiment of the present invention, FIG. 10 is a diagram illustrating exemplary numerical values of an error in an attenuation amount of the attenuator and the like, FIG. 11 is a diagram illustrating a relationship between a reference voltage Vref(H) and a gain control voltage Vc(RF), and the attenuation amount.

DESCRIPTION OF THE PREFERRED EMBODIMENTS

First Embodiment

Figure 1:
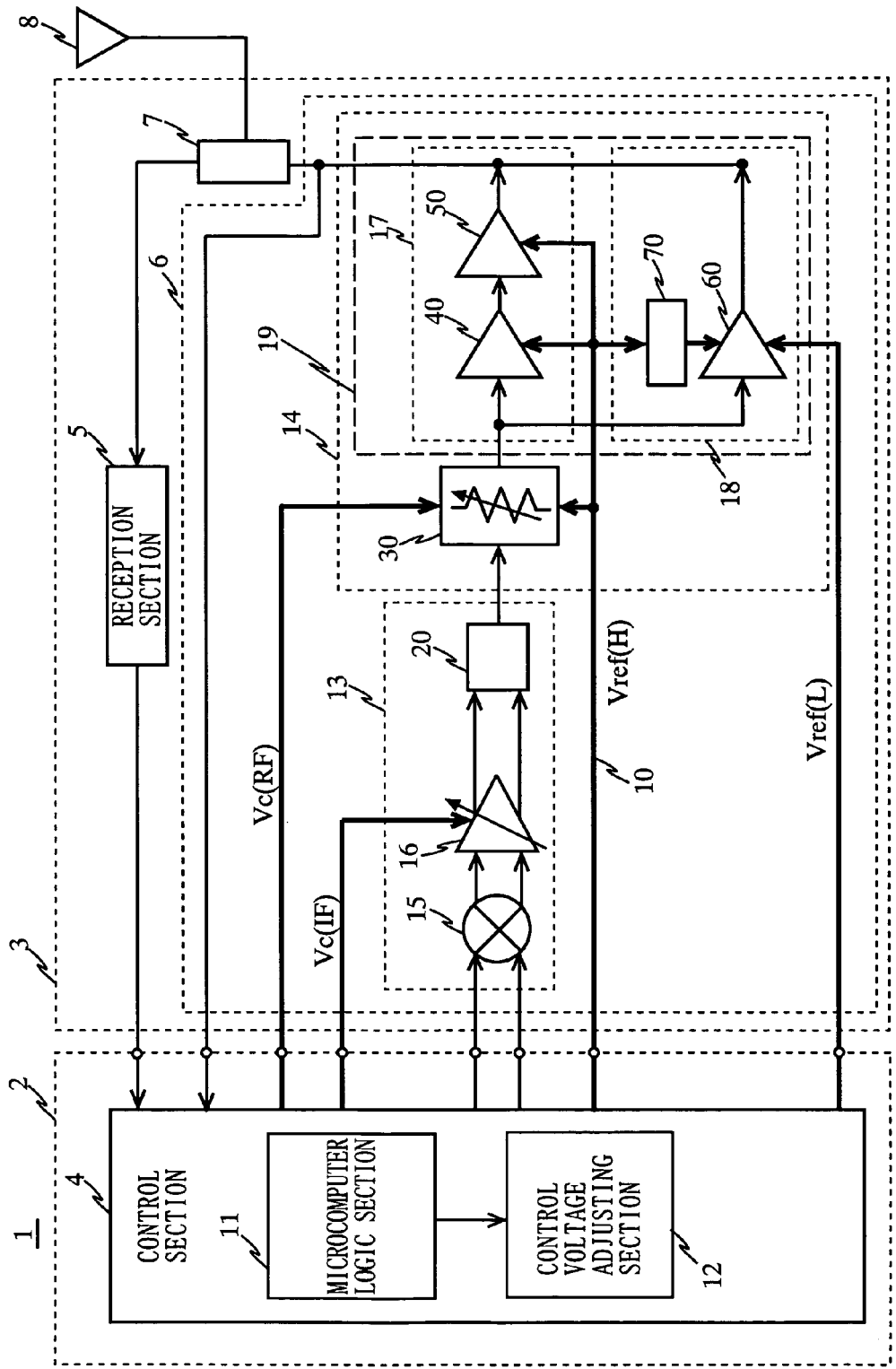
FIG. 1 is a diagram illustrating an exemplary structure of a mobile telephone terminal apparatus according to a first embodiment of the present invention.

FIG. 1 is a block diagram illustrating a structure of a mobile telephone terminal apparatus 1 according to a first embodiment of the present invention. The mobile telephone terminal apparatus 1 employs a mobile communication technique, such as WCDMA or the like, in which a transmission output level needs to be controlled in a range of 80 dB, specifically from −53 dBm to +27 dBm.

The mobile telephone terminal apparatus 1 comprises a radio section 3 of generating a transmission signal and a reception signal, and a base band section 2. The radio section 3 comprises a reception section 5, a transmission section 6, and a duplexer 7 which permits a single antenna to be used for both transmission and reception. The base band section 2 comprises a control section 4 having a microcomputer logic section 11 and a control voltage adjusting section 12, and performs a control of the reception section 5 and the transmission section 6, audio processing, and the like. The control voltage adjusting section 12 generates control voltages (a control voltage Vc(IF), a control voltage Vc(RF), a reference voltage Vref(H), and a reference voltage Vref(L)) for controlling each section included in the radio section 3 based on a voltage supplied from a power source (not shown), such as a 3.0-V lithium battery or the like, in accordance with a command signal output from the microcomputer logic section 11.

The transmission section 6 comprises an intermediate frequency section 13 of generating a signal to be transmitted to a base station, and a high frequency section 14 of amplifying the signal generated by the intermediate frequency section 13 to a desired magnitude. The intermediate frequency section 13 comprises a mixer 15, a variable gain amplifier 16, and a filter 20. An audio signal output from the control section 4 is frequency-converted by the mixer 15 and is then amplified by the variable gain amplifier 16. A gain of the variable gain amplifier 16 can be adjusted by adjusting the magnitude of the gain control voltage Vc(IF). The filter 20 passes only a signal having a predetermined frequency among output signals of the variable gain amplifier 16.

The high frequency section 14, which receives an output signal of the filter 20, comprises an attenuator 30 and a switch amplification section 19. The switch amplification section 19 comprises a high output level amplification section 17 and a low output level amplification section 18, which are arranged in parallel. The high output level amplification section 17 comprises a power amplifier (pre-amplifier) 40 and a power amplifier 50. The low output level amplification section 18 comprises a voltage adjusting circuit 70 and a power amplifier 60.

The high output level amplification section 17 and the low output level amplification section 18 are used while gains thereof are fixed to, for example, 30 dB and 15 dB, respectively. For example, the high output level amplification section 17 is used to obtain a transmission output level of 12 dBm or more, while the low output level amplification section 18 is used to obtain a transmission output level of less than 12 dBm. One of the amplification sections 17 and 18 is selected by switching the magnitude of the reference voltage Vref(H) supplied from a voltage supply line 10 between Vref(H1)=2.5 V and Vref(H2)=2.7 V. An amount of attenuation of the attenuator 30 is adjusted by changing the magnitude of the gain control voltage Vc(RF) while the reference voltage Vref(H) supplied from the voltage supply line 10 is applied to the attenuator 30.

The output signal of the filter 20 is attenuated by the attenuator 30 to a desired magnitude, is then amplified by the high output level amplification section 17 or the low output level amplification section 18, and is then transmitted via the duplexer 7 and from an antenna 8 to a base station.

The microcomputer logic section 11 of the control section 4 sets a target value for the transmission output level based on a signal received by the reception section 5, performs a feedback control of the reference voltage Vref(H), the gain control voltage Vc(RF), and the gain control voltage Vc(IF) so as to cause the transmission output level to approach the target value while comparing the set target value with an actual transmission output level. Note that the reference voltage Vref(L) is always maintained at a constant magnitude during transmission.

The transmission section 6 obtains a gain having a desired value in the range of 80 dB by combining a gain which is largely and discontinuously changed due to operation switching (consumed current switching) performed by the high output level amplification section 17 and the low output level amplification section 18, with a gain which is finely and continuously changed by the attenuator 30 and the variable gain amplifier 16.

Figure 2:
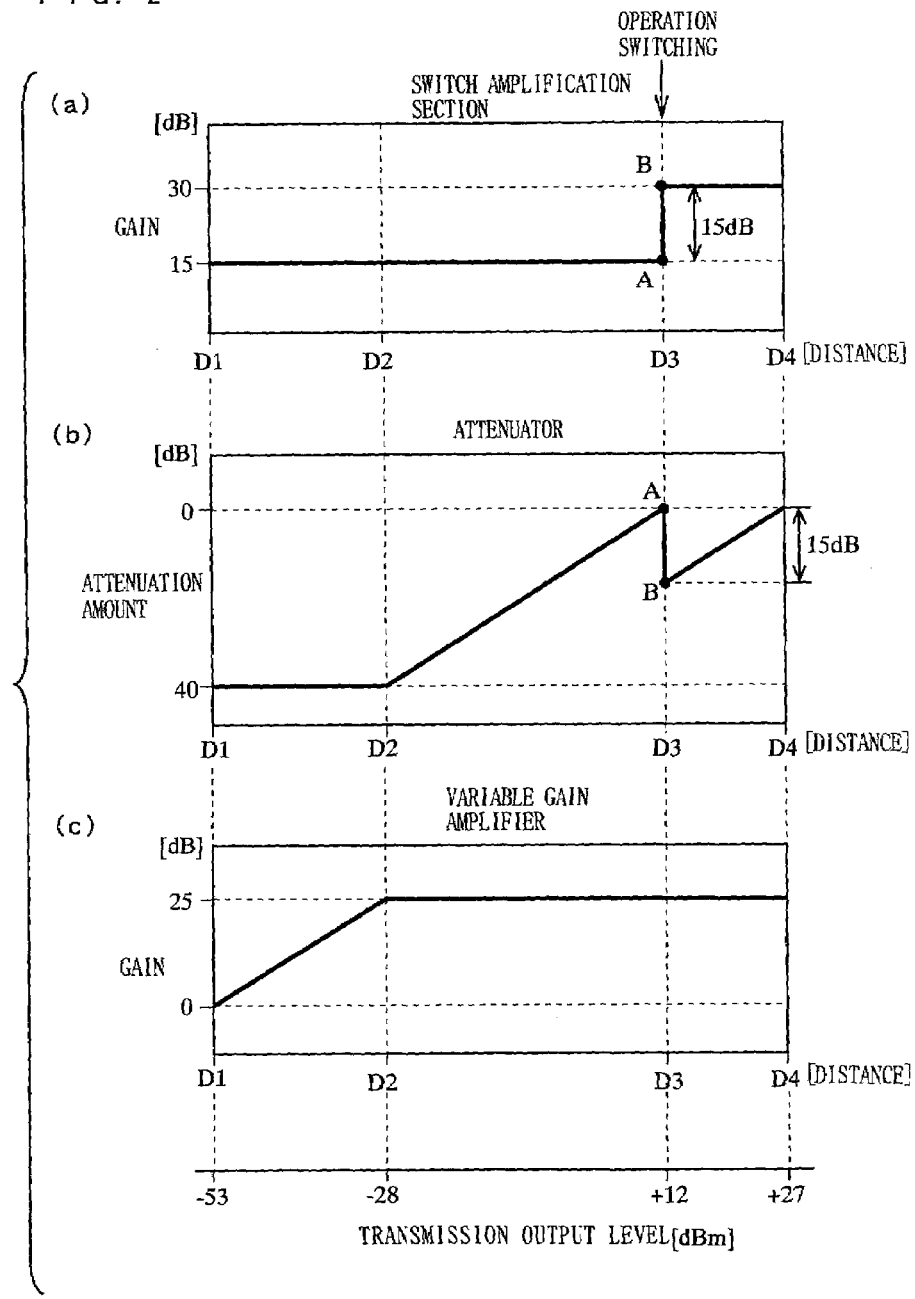
FIG. 2 is a diagram illustrating a relationship between a distance from a base station, a gain of a switch amplification section, an attenuation amount of an attenuator, and a gain of a variable gain amplifier.
Figure 12:
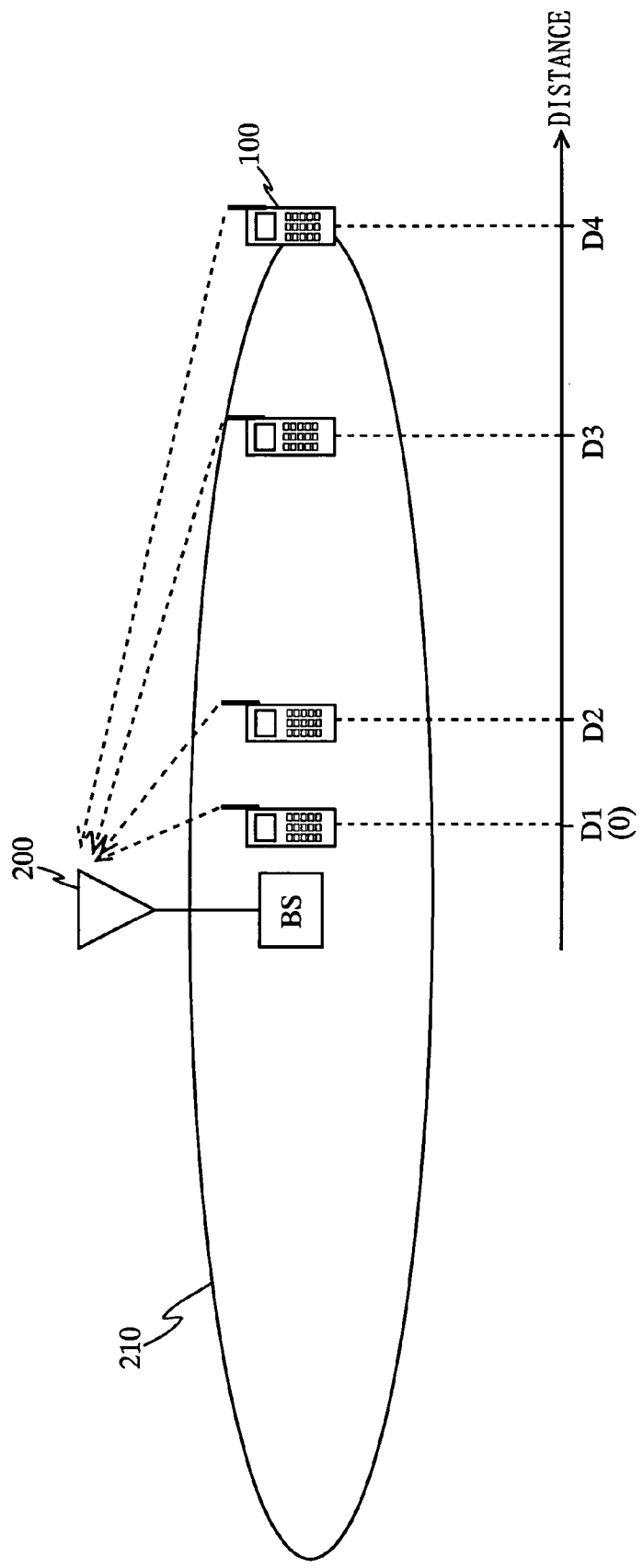
FIG. 12 is a diagram illustrating a base station, a cell range of the base station, and mobile telephone terminal apparatuses.
Figure 13:
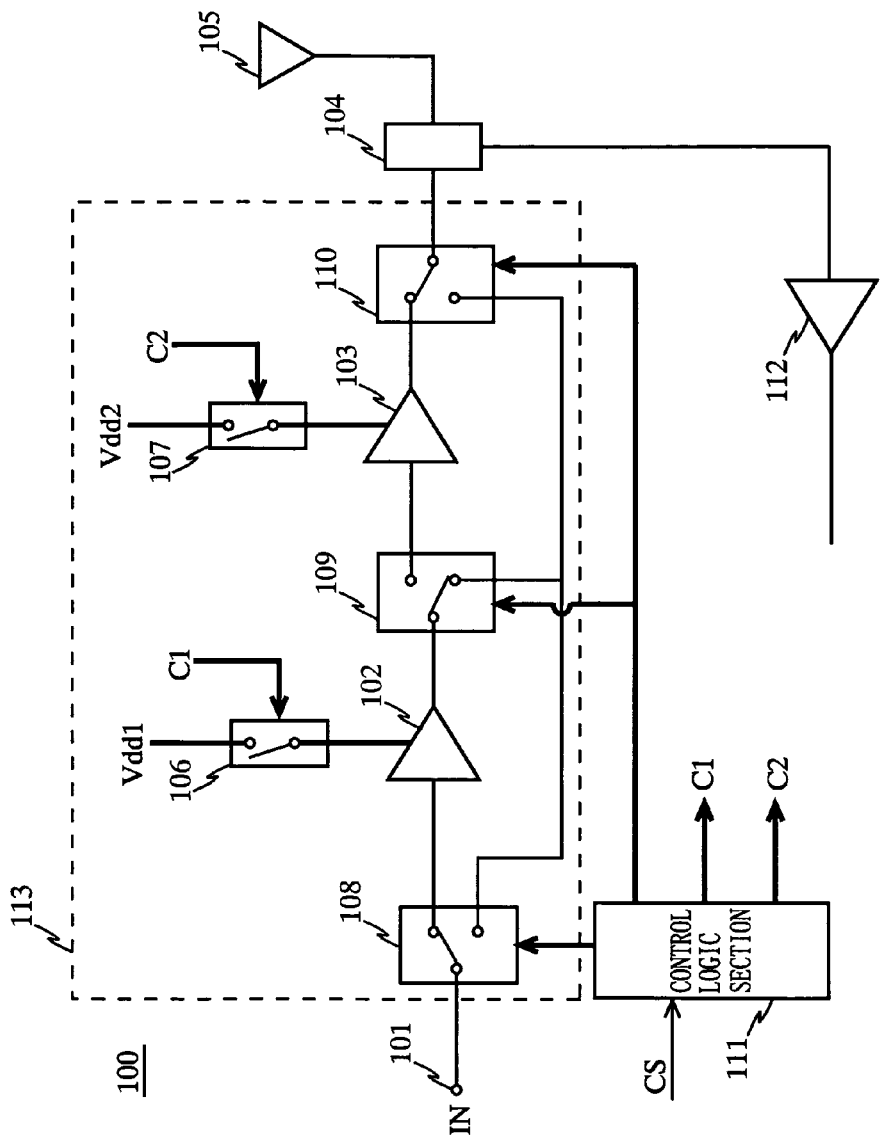
FIG. 13 is a diagram illustrating an exemplary structure of a conventional mobile telephone terminal apparatus.

Note that it is assumed that the mobile telephone terminal apparatus 1 is operated within the cell range 210 of the base station 200 (FIG. 12), i.e., a distance range of D1 (=0) to D4 between the base station 200 and the mobile telephone terminal apparatus 1. The transmission output level of the mobile telephone terminal apparatus 1 needs to be changed, depending on only the distance between the base station 200 and the mobile telephone terminal apparatus 1. FIG. 2 is a diagram illustrating a relationship between the distance between the base station 200 and the mobile telephone terminal apparatus 1 and gains in the switch amplification section 19, the attenuator 30, and the variable gain amplifier 16.

Note that required transmission output levels are assumed to be −53 dBm when the distance from the base station 200 is D1; −28 dBm when the distance is D2; +12 dBm when the distance is D3; and +27 dBm when the distance is D4. It is also assumed that when the transmission output level reaches +12 dBm, operation switching is performed by the switch amplification section 19.

As illustrated in (a) and (b) of FIG. 2, in order to prevent the gain of the whole transmission section 6 from being changed between immediately before and immediately after operation switching, operation switching of the amplification sections 17 and 18 and attenuation amount adjustment of the attenuator 30 need to be performed with the same timing. Therefore, in operation switching, a gain change amount of the switch amplification section 19 illustrated in (a) of FIG. 2 and a gain change amount of the attenuator 30 illustrated in (b) of FIG. 2 need to have a complementary relationship, i.e., the sum of the gain change amounts needs to be zero.

In order to meet these requirements, in the mobile telephone terminal apparatus 1 of the first embodiment, the amplification sections 17 and 18 and the attenuator 30, which are individually controlled with separate control voltages in conventional mobile telephone terminal apparatuses, are controlled with only the reference voltage Vref(H) supplied from the single voltage supply line 10.

Figure 3:
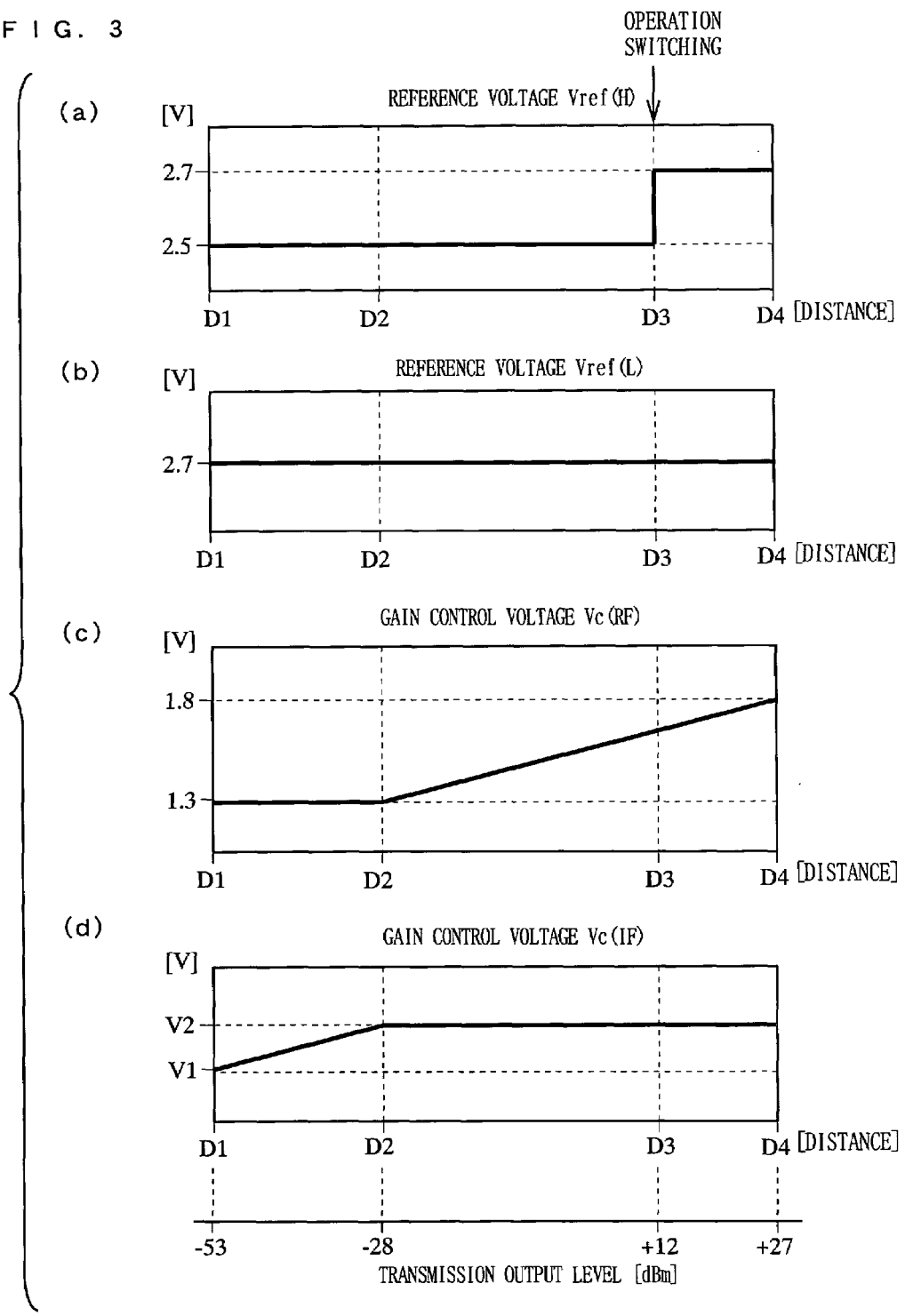
FIG. 3 is a diagram illustrating a relationship between a distance from a base station, a gain control voltage Vc(IF), a reference voltage Vref(H), a gain control voltage Vc(RF), and a reference voltage Vref(L)

Further, the control voltages (the reference voltage Vref(H), the reference voltage Vref(L), the gain control voltage Vc(RF), and the reference voltage Vc(IF)) are adjusted as illustrated in (a) to (d) of FIG. 3 so that the switch amplification section 19, the attenuator 30, and the variable gain amplifier 16 are controlled as illustrated in (a) to (c) of FIG. 2.

Specifically, the reference voltage Vref(H) is set to have a magnitude of 2.5 V when the distance from a base station is between D1 and D3 (when the transmission output level is between −53 dBm and +12 dBm) as illustrated in (a) of FIG. 3. When operation switching is performed, the reference voltage Vref(H) is switched to a magnitude of 2.7 V. When the distance between a base station is between D3 and D4 (when the transmission output level is between +12 dBm and +27 dBm), the reference voltage Vref(H) is set to have a magnitude of 2.7 V. In this manner, the magnitude of the reference voltage Vref(H) is discontinuously changed in operation switching. The gain change amount of the switch amplification section 19 due to operation switching is 15 dB. Note that the reference voltage Vref(L) is set to always have a constant magnitude of 2.7 V as illustrated in (b) of FIG. 3 in order to achieve operation switching of the switch amplification section 19.

As illustrated in (c) of FIG. 3, the gain control voltage Vc(RF) is set to have a magnitude of 1.3 V or less which is less than an operational threshold of the attenuator 30 (1.3 V in (c) of FIG. 3) when the distance from a base station is between D1 and D2 (when the transmission output level is between −53 dBm and −28 dBm). When the distance from a base station is increased from D2 to D4, the gain control voltage Vc(RF) is linearly increased from 1.3 V to 1.8 V. It should be noted that the magnitude of the gain control voltage Vc(RF) is not particularly adjusted in operation switching.

As illustrated in (d) of FIG. 3, the gain control voltage Vc(IF) is linearly increased from V1 to V2 when the distance from a base station is increased from D1 and D2 (when the transmission output level is between −53 dBm to −28 dBm). When the distance from a base station is between D2 and D4, the gain control voltage Vc(IF) is maintained at a constant magnitude of V2. In this manner, the magnitude of the gain control voltage Vc(IF) is also not particularly changed in operation switching.

Note that if the gain is lowered in the intermediate frequency section 13 in which a carrier signal level is low, a C/N ratio becomes small. Therefore, the gain of the variable gain amplifier 16 is adjusted in only a range in which a very small transmission output level is required.

In the mobile telephone terminal apparatus 1 of the first embodiment, a plurality of gain adjusters are all controlled using the reference voltage Vref(H), so that the gains of five gain adjusters (the variable gain amplifier 16, the attenuator 30, and the power amplifiers 40, 50 and 60) are controlled using four control voltages. One of the four control voltages (the reference voltage Vref(L)) does not require magnitude adjustment. Therefore, substantially only three control voltages may be adjusted.

As illustrated in (a) to (d) of FIG. 3, in the mobile telephone terminal apparatus 1, operation switching of the switch amplification section 19 and attenuation amount adjustment associated with operation switching of the attenuator 30 are performed only by changing the magnitude of the reference voltage Vref(H). In this manner, a plurality of gain adjusters are all controlled using a single voltage, thereby avoiding deviation between the control timing of each gain adjuster.

Therefore, when the switch amplification section 19 is in a gain state (point A) before operation switching ((a) of FIG. 2), the attenuator 30 is also in a gain state (point A) before operation switching ((b) of FIG. 2). When the switch amplification section 19 is in a gain state (point B) after operation switching ((a) of FIG. 2), the attenuator 30 is also in a gain state (point B) after operation switching ((b) of FIG. 2). Therefore, the gain of the whole transmission section 6 is not deviated from a desired value in operation switching.

On the other hand, when five gain adjusters are individually controlled using individually supplied control voltages as in conventional techniques, five control voltages are required. Even if the power amplifiers 50 and 60, which are included in the same high output level amplification section 17, are controlled using the same control voltage, four control voltages need to be individually adjusted as illustrated in (a) to (d) of FIG. 4.

Figure 4:
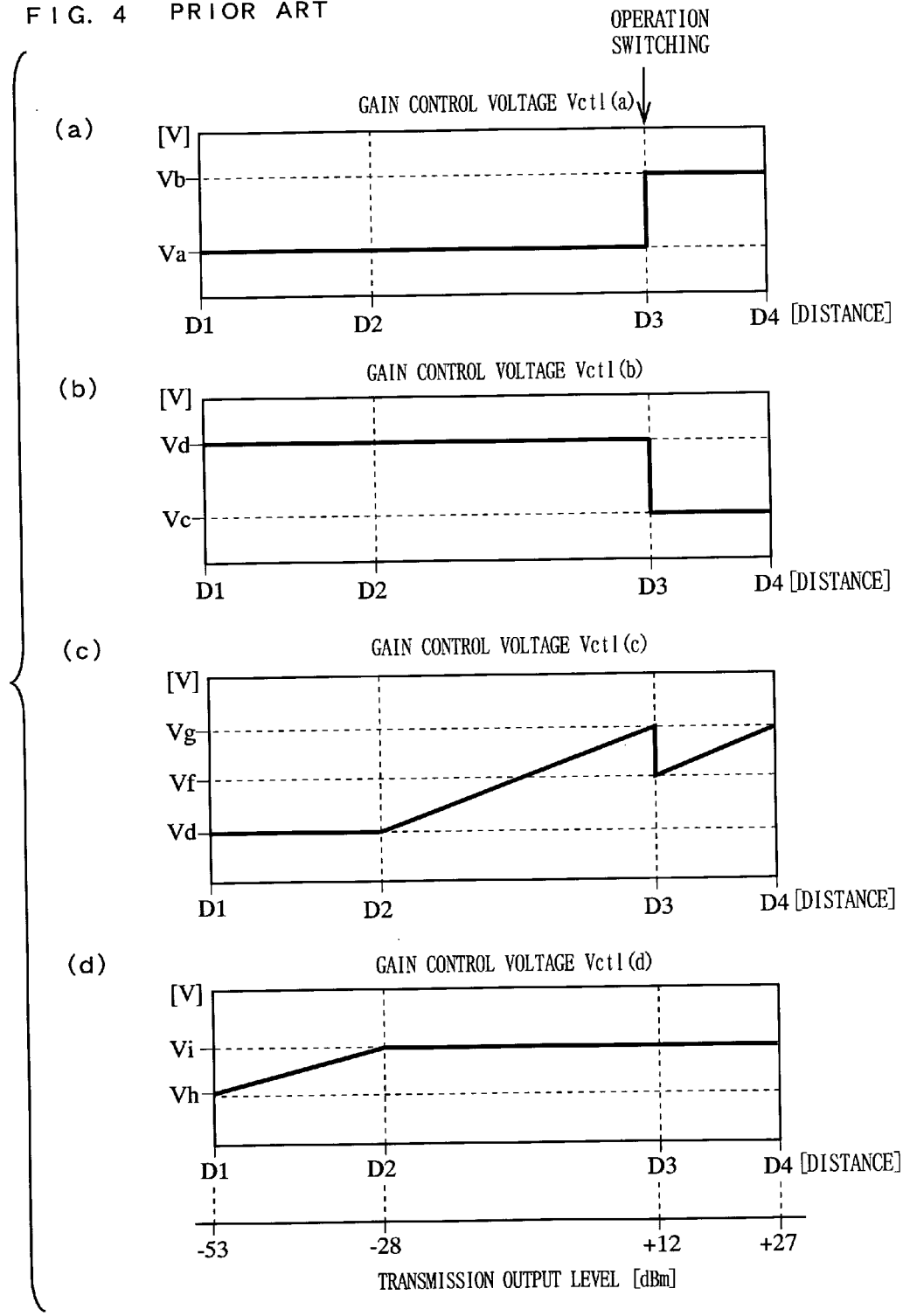
FIG. 4 is a diagram illustrating a relationship between a distance from a base station and each control voltage when a high output level amplification section, a low output level amplification section, an attenuator, and a variable gain amplifier are individually controlled with separate control voltages.

FIG. 4 is an expected diagram illustrating a relationship between the distance from the base station 200, and a gain control voltage Vctl(a) ((a) of FIG. 4), a gain control voltage Vctl(b) ((b) of FIG. 4), a gain control voltage Vctl(c) ((c) of FIG. 4), and a gain control voltage Vctl(d) ((d) of FIG. 4), which are used to individually control the high output level amplification section 17, the low output level amplification section 18, the attenuator 30, and the variable gain amplifier 16, respectively.

As illustrated in (c) of FIG. 4, when the gain adjusters are individually controlled, the gain control voltage Vctrl(c) needs to be largely changed in operation switching. When such a voltage adjustment is performed, the gain of the whole transmission section 6 is significantly deviated from an ideal value if timings of adjusting the gain control voltages are deviated from each other due to, for example, a time delay in the feedback control.

However, in the mobile telephone terminal apparatus 1 of the first embodiment, the gain adjustment of the power amplifier 40 and the attenuation amount adjustment of the attenuator 30 are performed by adjustment of only the reference voltage Vref(H), thereby avoiding occurrence of a variation in timings of adjusting the voltages. Therefore, when operation switching is performed, disturbance does not occur in the transmission output level of the mobile telephone terminal apparatus 1.

Hereinafter, an exemplary specific circuit structure of the switch amplification section 19 and the attenuator 30 will be described in which the operation switching of the switch amplification section 19 and the attenuation amount adjustment of the attenuator 30 are performed by adjusting only the reference voltage Vref(H) as described above.

Figure 5:
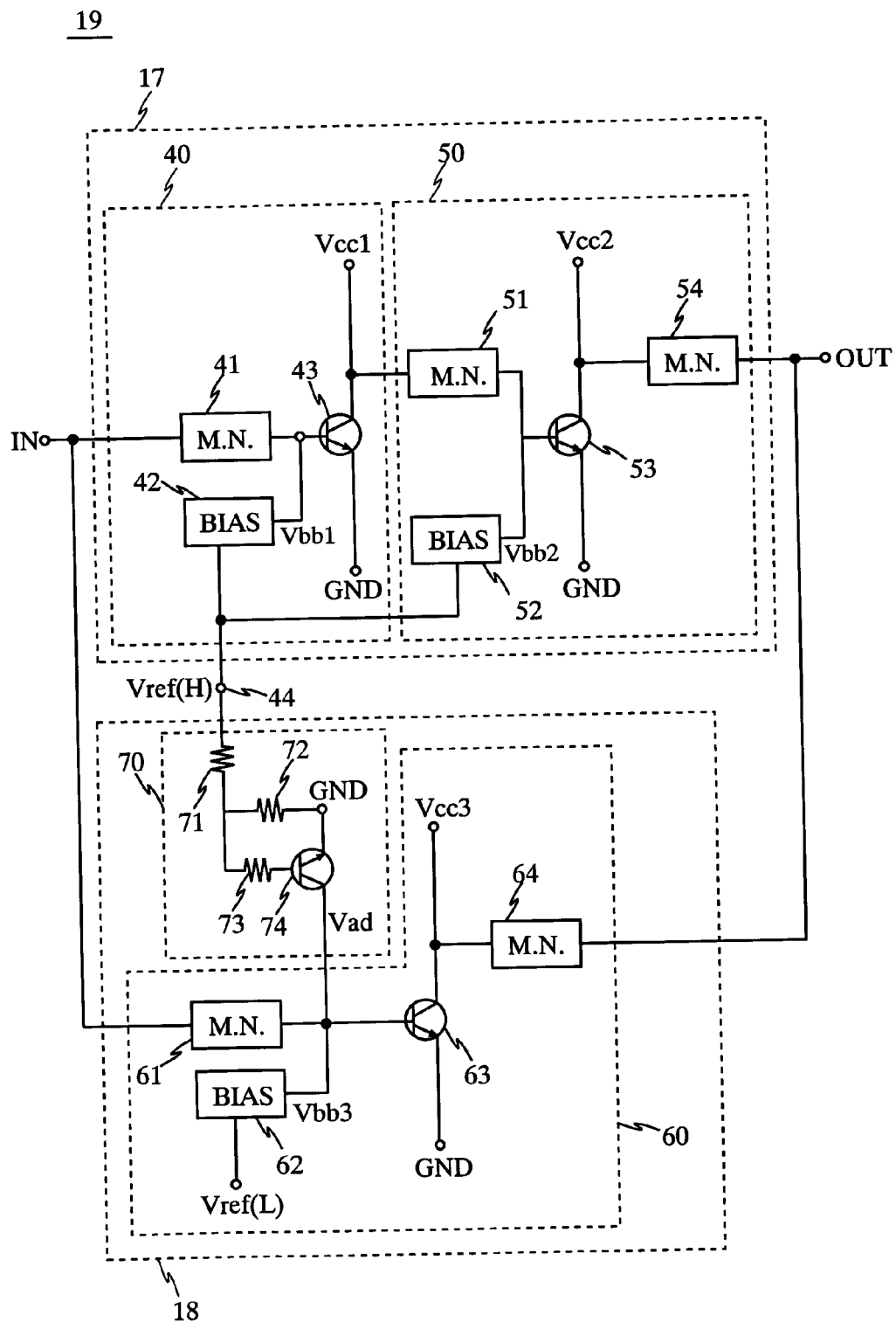
FIG. 5 is a diagram illustrating an exemplary circuit structure of a switch amplification section.

FIG. 5 illustrates an exemplary specific circuit structure of the switch amplification section 19. The power amplifier (preamplifier) 40 and the power amplifier 50 included in the high output level amplification section 17, and the power amplifier 60 included in the low output level amplification section 18 are power amplifiers having a general structure, which comprise input matching circuits 41, 51, and 61, base bias circuits 42, 52, and 62, and bipolar transistors 43, 53, and 63 whose emitter electrode is grounded, respectively.

The input matching circuits 41, 51, and 61 are connected to base electrodes of the bipolar transistors 43, 53, and 63, respectively. Output matching circuits 54 and 64 are connected to the collector electrodes of the bipolar transistors 53 and 63, respectively. The base bias circuits 42, 52, and 62 supply voltages to the base electrodes of the bipolar transistors 43, 53, and 63, respectively. Collector voltages Vcc1, Vcc2, and Vcc3 are supplied to the collector electrodes of the bipolar transistors 43, 53, and 63, respectively.

One end of the voltage adjusting circuit 70 is connected to a voltage supply point 44, while the other end thereof (the collector electrode of a bipolar transistor 74) is connected between base electrode of the bipolar transistor 63 and the input matching circuit 61.

The voltage adjusting circuit 70 of FIG. 5 comprises resistors 71, 72, and 73. The upper and lower limits of resistances of the resistors 71, 72, and 73 are set so as to prevent a change in the gain of the power amplifier 60 and an erroneous operation of operation switching when a high frequency (noise) enters. For example, when isolation is less than 10 dB, a high frequency signal enters. Therefore, the lower limit of the resistors 71, 72, and 73 may be set to be 100 Ω. When a voltage drop of the resistors 71, 72, and 73 exceeds about 0.1 V, there may be an influence which is not negligible to gain control characteristics. Therefore, the upper limit may be determined in consideration of such a value. Specifically, when a base leakage current is assumed to be 1 μA, the upper limit of the resistors 71, 72, and 73 is considered to be 100 Ω according to the general Ohm's law.

The ON/OFF of the bipolar transistors 43, 53, 63, and 74 is controlled by adjusting a potential difference between a base electrode and an emitter electrode thereof (a base-emitter voltage Vbe). Since the emitter electrodes of the bipolar transistors 43, 53, 63, and 74 are grounded, the ON/OFF of the bipolar transistors 43 and 53 is substantially controlled by adjusting a voltage supplied to the base electrode.

The bipolar transistors 43, 53, 63, and 74 of FIG. 5 are all produced on the same semiconductor substrate and by the same manufacturing process, and have the same current cut-off voltage V1 of 1.3 V. The bipolar transistors 43, 53, 63, and 74 are turned ON when the base-emitter voltage Vbe is larger than the current cut-off voltage Vi (Vbe>Vi), and are turned OFF when the base-emitter voltage Vbe is smaller than or equal to the current cut-off voltage V1 (Vbe≦Vi).

Thus, although the bipolar transistors 43, 53, and 63 have the same characteristics, by providing the voltage adjusting circuit 70 and supplying the reference voltage Vref(L) to the bipolar transistor 63, a circuit is designed so that when the bipolar transistors 43 and 53 are turned ON (OFF), the bipolar transistor 63 is turned OFF (ON).

More specifically, when a reference voltage of 2.5 V is supplied to the voltage supply point 44, the base-emitter voltage of the bipolar transistors 43 and 53 becomes less than 1.3 V, so that the bipolar transistors 43 and 53 are turned OFF.

Also when a reference voltage of 2.5 V is supplied to the voltage supply point 44, the base-emitter voltage of the bipolar transistor 74 becomes less than 1.3 V, so that the bipolar transistor 74 is turned OFF. In this case, the base voltage of the bipolar transistor 63, which is determined based on a voltage Vbb3 (1.3 V or more) supplied from the base bias circuit 62 and a collector voltage Vad of the bipolar transistor 74, becomes 1.3 V or more, so that the bipolar transistor 63 is turned ON and then amplification is performed in the low output level amplification section 18. In this case, the gain of the low output level amplification section 18 is 15 dB as illustrated in (a) of FIG. 2, and a consumed current is 50 mA.

On the other hand, when the reference voltage Vref(H) of 2.7 V is supplied to the voltage supply point 44, the base voltages of the bipolar transistors 43 and 53 becomes 1.3 V or more, so that the bipolar transistors 43 and 53 are turned ON and then amplification is performed in the high output level amplification section 17. In this case, the gain of the high output level amplification section 17 is 30 dB as illustrated in (a) of FIG. 2, and a consumed current is 100 mA.

Also when the reference voltage Vref(H) of 2.7 V is supplied to the voltage supply point 44, the base-emitter voltage of the bipolar transistor 74 becomes 1.3 V or more, so that the bipolar transistor 74 is turned ON. In this case, the base voltage of the bipolar transistor 63, which is determined based on the voltage Vbb3 (1.3 V or more) supplied from the base bias circuit 62 and the collector voltage Vad of the bipolar transistor 74, becomes less than 1.3 V, so that the bipolar transistor 63 is turned OFF.

Figure 6:
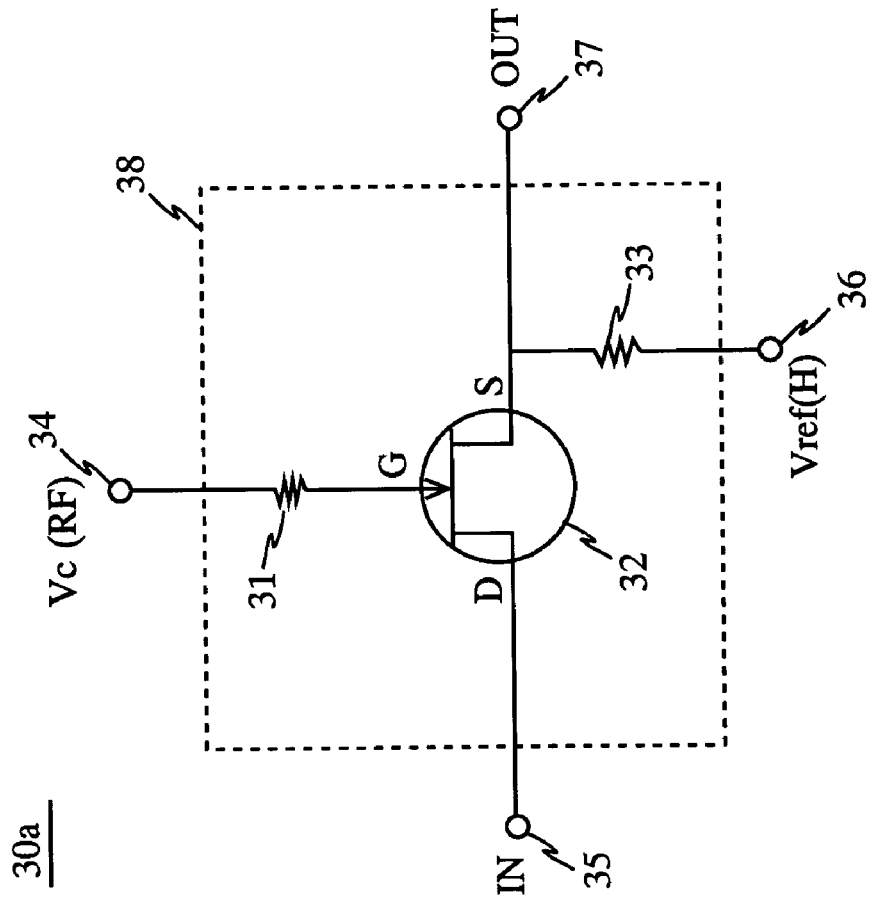
FIG. 6 is a diagram illustrating an exemplary circuit structure of an attenuator.

FIG. 6 illustrates an exemplary circuit structure of the attenuator 30 which is used in combination with the switch amplification section 19 of FIG. 5. An attenuator 30a of FIG. 6 comprises a variable resistance section 38 composed of a field effect transistor 32 and resistors 31 and 33, a signal input terminal 35, a signal output terminal 37, a gain control voltage applying terminal 34, and a reference voltage applying terminal 36. An audio signal output from the intermediate frequency section 13 is input to the signal input terminal 35, is attenuated to a predetermined magnitude by the variable resistance section 38, and is output through the signal output terminal 37.

The resistors 31 and 33 of FIG. 6 are provided to prevent a change in a gain of the attenuator 30a when a high frequency (noise) enters. One end of the resistor 31 is connected to the gain control voltage applying terminal 34, while the other end thereof is connected to a gate electrode of the field effect transistor 32. One end of the resistor 33 is connected between a source electrode of the field effect transistor 32 and the signal output terminal 37, the other end thereof is connected to the reference voltage applying terminal 36.

For example, when isolation is less than 20 dB, a high frequency signal enters the field effect transistor 32. Therefore, the lower limit of the resistors 31 and 33 is considered to be 1 kΩ. When a voltage drop of the resistors 31 and 33 exceeds about 0.1 V, there may be an influence which is not negligible to gain control characteristics. Therefore, the upper limit may be determined in consideration of such a value. For example, when a gate leakage current is assumed to be 1 μA, the upper limit of the resistors 31 and 33 is considered to be 100 Ω according to the general Ohm's law.

An attenuation amount of the attenuator 30a is determined, depending on a resistance of the variable resistance section 38. In the case of the circuit structure of FIG. 6, the magnitude of the resistance of the variable resistance section 38 is determined, depending on a potential difference between the gate and source of the field effect transistor 32 (gate-source voltage Vgs). The gate-source voltage Vgs is determined, depending on the gain control voltage Vc(RF) supplied to the gain control voltage applying terminal 34 and the reference voltage Vref(H) supplied to the reference voltage applying terminal 36. Therefore, the attenuation amount is adjusted by controlling the gain control voltage Vc(RF) and the reference voltage Vref(H).

Figure 7:
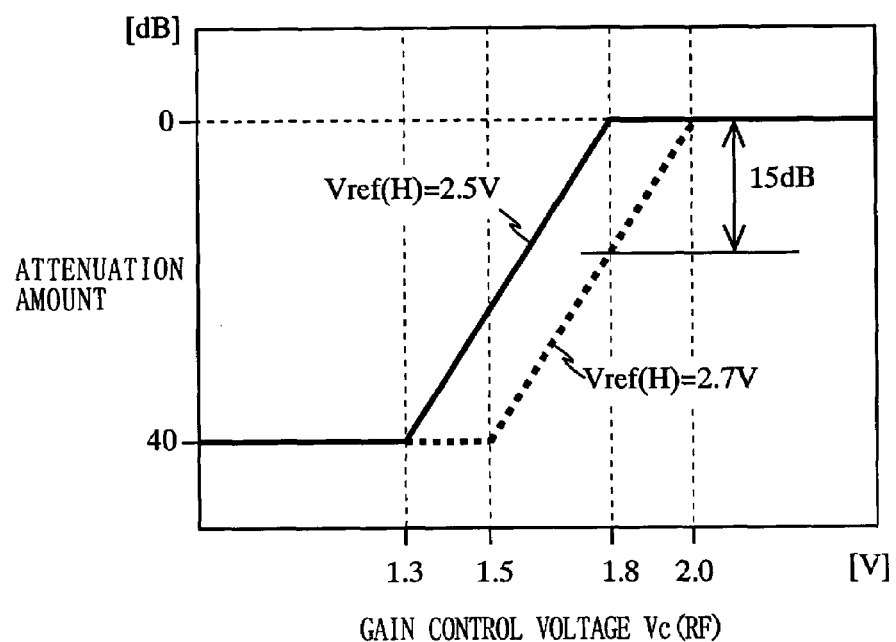
FIG. 7 is a diagram illustrating a relationship between a reference voltage Vref(H) and a gain control voltage Vc(RF), and an attenuation amount.

FIG. 7 is a diagram illustrating a relationship between the gain control voltage Vc(RF) and the reference voltage Vref(H) which are supplied to the attenuator 30a of FIG. 6, and the attenuation amount. When the reference voltage Vref(H) is 2.5 V, the gain control voltage Vc(RF), which is an operational threshold of the attenuator 30a, is 1.3 V. In this case, as indicated with a thick solid line, the attenuation amount is changed by adjusting the gain control voltage Vc(RF) in the range of 1.3 V to 1.8 V. Also when the reference voltage Vref(H) is 2.5 V, the gain control voltage Vc(RF), which is an operational threshold of the attenuator 30a, is 1.5 V. In this case, as indicated with a thick dashed line, the attenuation amount is changed by adjusting the gain control voltage Vc(RF) in the range of 1.5 V to 2.0 V.

As illustrated in (a) and (c) of FIG. 3, in order that the reference voltage Vref(H) and the gain control voltage Vc(RF) are adjusted, operation switching of the switch amplification section 19 is performed when the gain control voltage Vc(RF) is 1.8 V where the attenuation amount of the attenuator 30a is minimum when the reference voltage Vref(H) is 2.5 V. In this case, a control for particularly changing a value of the gain control voltage Vc(RF) is not performed.

In the first embodiment, operation switching is performed when the transmission output level is 12 dBm. However, operation switching may be performed in any range of the gain control voltage Vc(RF) in which the attenuation amount of the attenuator 30a can be changed so that a change in the gain of the switch amplification section 19 is canceled (1.5 V to 1.8 V in FIG. 7).

Figure 14:
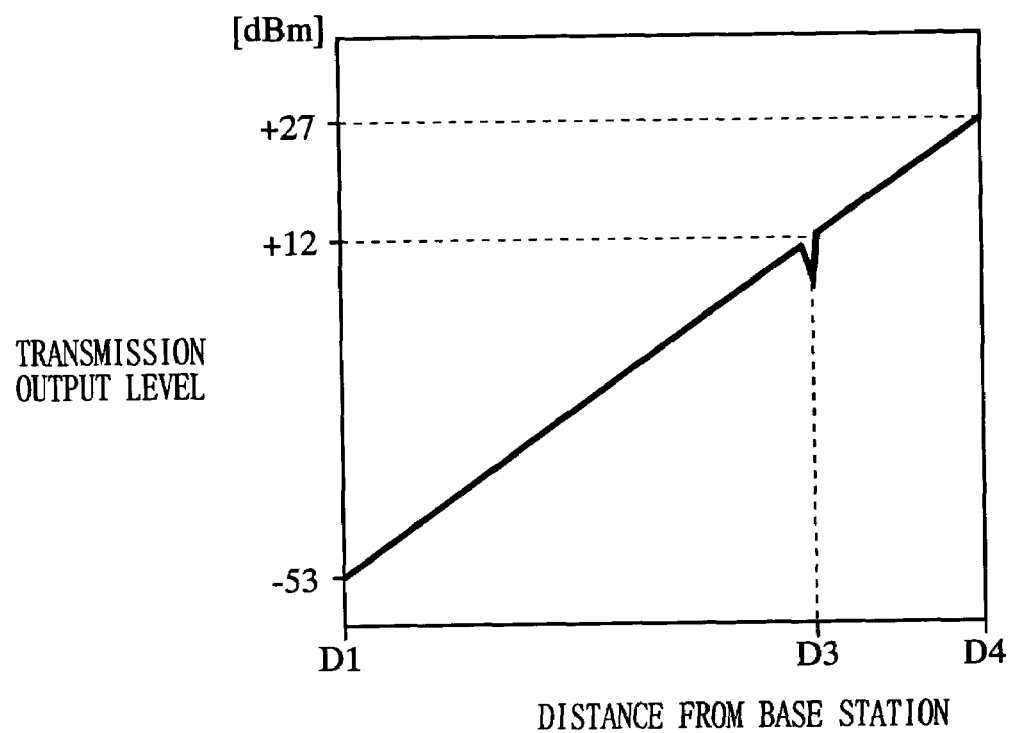
FIG. 14 is a diagram illustrating transmission output level characteristics of a conventional mobile telephone terminal apparatus.

FIG. 8 is a diagram illustrating the transmission output level of the mobile telephone terminal apparatus 1 of the first embodiment with respect to the distance between the mobile telephone terminal apparatus 1 and a base station. In conventional mobile telephone terminal apparatuses, the transmission output level is disturbed in operation switching as illustrated in FIG. 14. According to the mobile telephone terminal apparatus 1 of the first embodiment of the present invention, the transmission output level is not disturbed even in operation switching. This is because, as illustrated in (a) to (d) of FIG. 3, only by changing the magnitude of the reference voltage Vref(H), the switching of the amplification sections 17 and 18 and the attenuation amount adjustment of the attenuator 30a associated with the switching of the amplification sections 17 and 18 are performed.

In the mobile telephone terminal apparatus 1 of the first embodiment, a plurality of gain adjusters are controlled only by switching of voltages supplied from a single voltage supply line, so that the gain adjusters can be controlled with the same timing. Therefore, the timing of switching of the power amplifiers 40, 50, and 60 and the timing of attenuation amount adjustment of the attenuator 30 associated with the switching of the power amplifiers 40, 50, and 60 are not deviated from each other, so that the transmission output level is not disturbed in operation switching. Thus, according to the mobile telephone terminal apparatus 1 of the first embodiment of the present invention, highly accurate control can be easily achieved, so that higher-quality telephone conversation than that of conventional techniques can be achieved.

Also in the mobile telephone terminal apparatus 1 of the first embodiment of the present invention, when a power source voltage is suddenly changed, the gain can be easily adjusted, so that the desired gain can be quickly obtained, as compared to mobile telephone terminal apparatuses in which a plurality of voltages are individually adjusted. In addition, as the number of voltages to be controlled is decreased, a variation in each control voltage is correspondingly reduced.

Further, the power amplifiers 40, 50, and 60 and the attenuator 30 of the high frequency section 14 can be formed on a single semiconductor substrate. Therefore, the high frequency section 14 can be miniaturized to a further extent than when power amplifiers and an attenuator individually produced are combined. The high frequency section 14 may be formed on a semiconductor substrate, such as a gallium arsenide (GaAs) substrate, a silicon (Si) substrate, a silicon germanium (SiGe) substrate, or the like, or alternatively, a ceramic or resin substrate. Particularly, when a semiconductor substrate, such as a silicon substrate, a silicon germanium substrate, or the like, is used, the microcomputer logic section 11 of the control section 4 can be formed on the same substrate.

When the power amplifiers 40, 50, and 60 of the high frequency section 14 are formed on the same semiconductor substrate, the bipolar transistors 43, 53, and 63 included in the respective power amplifiers 40, 50, and 60 can be caused to have the same current amplification rate (hfe). Therefore, in this case, voltage correction can be easily performed in the base bias circuits 42, 52, and 62. Similarly, when the power amplifiers 40, 50, and 60 and the attenuator 30 are formed on the same semiconductor substrate, circuit design and voltage correction can be easily performed in consideration of variations in the threshold of the field effect transistor 32 included in the attenuator 30, and variations in the current amplification rates of the bipolar transistors 43, 53, and 63 of the power amplifier 40, 50, and 60.

Actually, the transmission output level is adjusted in consideration of an attenuation action of a component, such as the filter 20 to be adjusted, other than the switch amplification section 19, the attenuator 30, and the variable gain amplifier 16. In the first embodiment, when the mobile telephone terminal apparatus 1 is operated with a maximum output (+27 dBm), sections thereof have the following signal levels: +27 dBm at an output end of the power amplifier 50; +12 dBm at an output end of the power amplifier 40; −3 dBm at an output end of the attenuator 30; −2 dBm at an output end of the filter 20; +1 dBm at an output end of the variable gain amplifier 16; and −15 dBm at the mixer 15. The output end of the filter 20 of the mobile telephone terminal apparatus 1 is operated in a 1950-MHz band.

Note that the mobile telephone terminal apparatus 1 can be used in various digital mobile communication methods, such as CDMA (IS-95) (CDMA: Code Division Multiple Access), CDMA2000, GSM (Global System for Mobile Communications), EDGE (Enhanced Data GSM Environment), UMTS (Universal Mobile Telecommunications), PCS (Personal communication Services), PDC (Personal Digital Cellular), PHS (Personal Handy-phone System), and the like, in addition to WCDMA. The transmission section 6 of the mobile telephone terminal apparatus 1 can be used in communication terminal apparatuses in addition to mobile telephones.

Note that the number of power amplifiers used in each of the amplification sections 17 and 18 is not particularly limited. Although, in the first embodiment of the present invention, two amplification sections (i.e., the high output level amplification section 17 and the low output level amplification section 18) are used, a larger number of amplification sections may be provided. Moreover, the amplification sections may be connected in cascade.

Note that the variable resistance section 38 of the attenuator 30*a* of FIG. 6 may have a plurality of field effect transistors which are connected in series. Although the field effect transistor 32 is used in the variable resistance section 38 of the variable gain amplifier 16 in FIG. 6, a device, such as a diode or the like, may be used instead of the field effect transistor 32.

Also in FIG. 6, the number of gates of the effect transistor included in the variable resistance section 38 of the attenuator 30*a* is one. Alternatively, a plurality of gates may be used (multi-gate type). As the number of gates is increased, a gain control width is broader. In this case, even when an input signal is high, a gain control can be carried out while suppressing a deterioration in distortion characteristics.

Second Embodiment

Each voltage produced by the control section 4 of FIG. 1 actually has an error due to a fluctuation in a power source voltage or a variation in circuit characteristics. Therefore, a voltage Vp (Vref(H)) actually supplied to the attenuator 30 or the switch amplification section 19 is represented by:

$$Vp\ (Vref(H)) = Vref(H) + dV \quad (1)$$

where an error dV is generally about ±3% of the reference voltage Vref(H).

Figure 9:
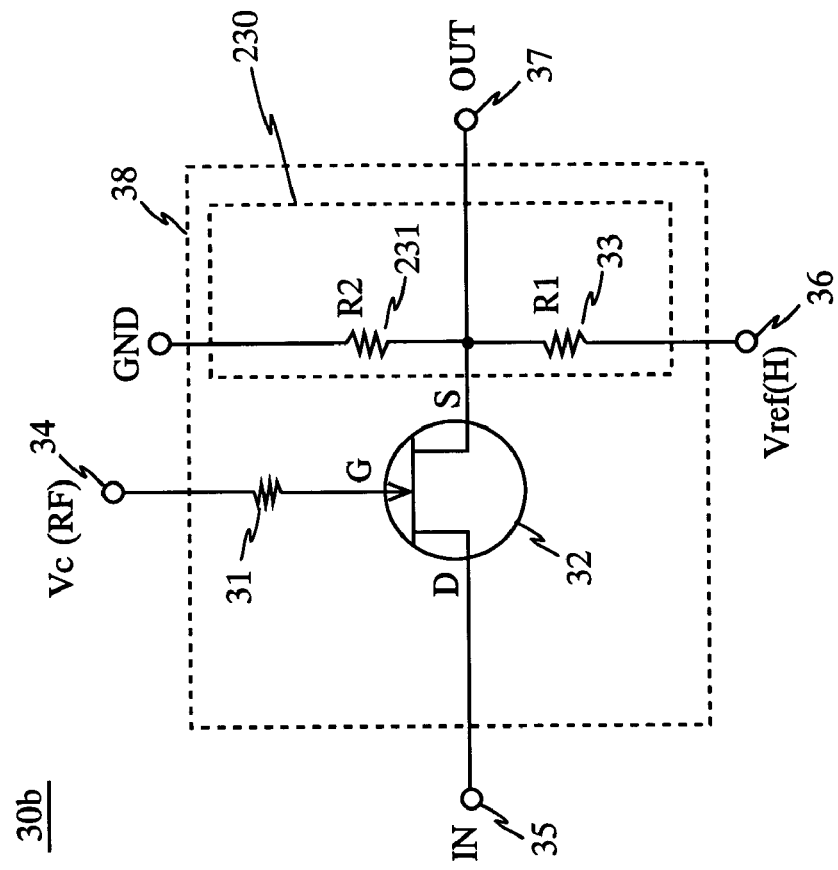
FIG. 9 is a diagram illustrating an exemplary circuit structure of an attenuator according to a second embodiment of the present invention.

FIG. 9 illustrates an attenuator 30*b* of a mobile telephone terminal apparatus 1 according to a second embodiment of the present invention, which is a variation of the attenuator 30 of FIG. 1. The attenuator 30*b* of FIG. 9 is obtained by adding a resistor 231 whose end is grounded to the attenuator 30*a* of FIG. 6. The resistor 33 and the resistor 231 constitute a voltage divider 230 which divides the reference voltage Vref (H). Among the components of the attenuator 30*b* of FIG. 9, the same components as those of the attenuator 30*a* of FIG. 6 are indicated with the same reference numerals and will not be explained. The mobile telephone terminal apparatus 1 of FIG. 1 has been described in the first embodiment and will not be explained again.

The voltage divider 230 is provided so as to reduce an error in an attenuation amount which is based on the error dV of the reference voltage Vref(H). A voltage Vps applied to the source electrode of the field effect transistor 32 in consideration of the error dV is represented by:

$$Vps = Vs + dVs \quad (2)$$
$$= (R1/(R1+R2)) \times Vp\ (Vref\ (H))$$

where R1 represents a resistance of the resistor 33 of FIG. 9, R2 represents a resistance of the resistor 231 of FIG. 9, and dVs represents an error in a voltage Vs applied to the source electrode of the field effect transistor 32. As illustrated in expression (2), when the voltage divider 230 is provided, the magnitude of the voltage Vs applied to the source electrode of the field effect transistor 32 and the error dVs is (R1/(R1+R2)) times as high as when the voltage divider 230 is not provided.

By providing the voltage divider 230 to reduce the voltage applied to the field effect transistor 32, an error in the applied voltage is reduced. In this case, an error dAtt in the attenuation amount is also suppressed, which is represented by:

$$dAtt = GS \times dVs \quad (3)$$
$$= GS \times (R1/(R1+R2)) \times dV$$

where GS represents a gain control sensitivity specific to the attenuator 30*b*.

FIG. 10 illustrates exemplary numerical values of the resistances R1 and R2, reference voltages Vref(H)_L and Vref(H)_H and errors dV thereof, and the error dAtt of the attenuation amount. In FIG. 10, a "first mode" indicates a mode in which the low output level amplification section 18 is driven. A "second mode" indicates a mode in which the high output level amplification section 17 is driven. The reference voltage Vref(H) in the first mode and the reference voltage Vref(H) in the second mode are distinguished from each other by being designating as Vref(H)_L and Vref(H)_H, respectively.

As illustrated in (a) of FIG. 10, when R1:R2 is assumed to be 1:1, an error in the attenuation amount of the attenuator 30*b* is half an error in the attenuation amount of the attenuator 30*a* under the same conditions except that the resistor 231 is not provided. Note that the values illustrated in FIG. 10 are calculated, assuming that a variation in the reference voltage Vref(H) is 3% and the gain control sensitivity GS of the attenuators 30*a* and 30*b* is 80 dB/V. According to a design example, the magnitude of the resistance R2 is desirably about 100 Ω to 100 kΩ. Note that the threshold of the field effect transistor 32 may be set to be +0.15 V in order to obtain the same attenuation characteristics as those of FIG. 7.

As the magnitude of the reference voltage Vref(H) is decreased or the ratio of the resistances (R1/R2) is decreased, the voltage applied to the source electrode is reduced, so that an error in the applied voltage is reduced, leading to a reduction in an error in the attenuation amount. In order to minimize an error in the attenuation amount, the voltage applied to the source electrode may be set to be 0 V. According to a design example, as illustrated in (b) of FIG. 10, when R1, R2, and the reference voltage Vref(H)_L are set to be 12.5 kΩ, 1 kΩ, and 0 V, respectively, the error dAtt in the attenuation amount is also 0. The magnitude of R2 is desirably about 100 Ω to 100 kΩ. Note that the threshold of the field effect transistor 32 may be set to be +1.3 V in order to obtain the same attenuation characteristics as those of FIG. 7.

As illustrated in FIG. 9, an end of the resistor 231 is grounded. Therefore, when the reference voltage Vref(H)_L is 0 V, the voltage applied to the source electrode of the field effect transistor 32 is 0 V. When the error dV in the reference voltage Vref(H)_L is 0 V, a variation is unlikely to occur in the transmission output level, whereby good quality is maintained in telephone conversation. When the reference voltage Vref(H)_L is 0 V, the power consumption of the mobile telephone terminal apparatus 1 can be reduced. Note that when the reference voltage Vref(H)_L is 0 V, the low output level amplification section 18 is driven in the switch amplification section 19 described in the first embodiment with reference to FIG. 5.

The attenuation amount of the attenuator 30b is determined, depending on a potential difference between the source and gate electrodes. Therefore, the gain control voltage Vc(RF) may have an appropriate magnitude corresponding to the voltage applied to the source electrode and a desired attenuation amount. In order to obtain the same attenuation characteristics as those of the attenuator 30a, the magnitude of the gain control voltage Vc(RF) supplied to the attenuator 30b may be set to be smaller by a predetermined magnitude than the gain control voltage Vc(RF) supplied to the attenuator 30a. The predetermined magnitude is a magnitude by which the voltage applied to the source electrode of the field effect transistor 32 is reduced by providing the voltage divider 230. When the attenuator 30b is used, the gain control voltage Vc(RF) is caused to be smaller than when the attenuator 30a is used, resulting in a smaller error therein. Therefore, when the attenuator 30b is used, an error in the attenuation amount is caused to be smaller than when the attenuator 30a is used.

FIG. 11 is a more general diagram than FIG. 7, illustrating a relationship between the reference voltages Vref(H)_L and Vref(H)_H, the gain control voltage Vc(RF), and the attenuation amount. A range B illustrated in FIG. 11 indicates a range in which a difference in the attenuation amount between the reference voltages Vref(H)_L and Vref(H)_H with respect to the same gain control voltage Vc(RF) is a constant value D. The constant value D is a value which cancels a gain difference between the high output level amplification section 17 and the low output level amplification section 18. The reference voltages Vref(H)_L and Vref(H)_H may be selected so that such a range B can be provided. When the transmission output level is adjusted, switching the magnitude between the reference voltage Vref(H)_L and Vref(H)_H may be performed within the range B.

In the second embodiment, the attenuator 30b comprises the voltage divider 230 to provide a function of adjusting the voltage applied to the field effect transistor 32. By providing the voltage divider 230, the magnitude of the voltage supplied to the switch amplification section 19 and the magnitude of the substantial voltage for adjusting the attenuation amount of the attenuator 30b can be distinguished from each other even when the same reference voltage Vref(H) is used to control the switch amplification section 19 and the attenuator 30b.

When the same reference voltage Vref(H) is used to control the switch amplification section 19 and the attenuator 30b, the switch amplification section 19 and the attenuator 30b can be controlled with the same timing, so that a variation in the transmission output level can be suppressed. In addition, by providing the voltage divider 230 to reduce a control voltage for the attenuator 30b, an error in the attenuation amount of the attenuator 30b can be suppressed, leading to suppression of a variation in the output level of the the mobile telephone terminal apparatus 1.

When the attenuator 30b and the switch amplification section 19 are controlled with the same reference voltage Vref (H), the attenuator 30b and the switch amplification section 19 need to be designed in consideration of the attenuation amount of the attenuator 30b and the amplification amount of the switch amplification section 19. In this case, when the voltage divider 230 is provided in the attenuator 30b, the voltage applied to the field effect transistor 32 can be adjusted by adjusting the ratio of the resistor 33 and the resistor 231, whereby the circuits of the attenuator 30b and the switch amplification section 19 can be designed more easily.

While the invention has been described in detail, the foregoing description is in all aspects illustrative and not restrictive. It is understood that numerous other modifications and variations can be devised without departing from the scope of the invention.

What is claimed is:

1. A transmission apparatus of continuously adjusting a magnitude of a transmission output level by changing a combination of gains of a plurality of gain adjusters, the apparatus comprising:
   a first one of the plurality of gain adjusters of receiving a supply of a first control voltage and discontinuously changing the gain thereof, depending on the first control voltage which is discontinuously changed; and
   a second one of the plurality of gain adjusters connected in series to the first gain adjuster, of receiving a supply of the first control voltage and a second control voltage and continuously changing the gain thereof, depending on the second control voltage which is continuously changed,
   wherein a sum of gain change amounts of the first and second gain adjusters due to the discontinuous change in the first control voltage is substantially zero when the second control voltage is constantly maintained at a predetermined magnitude.

2. The transmission apparatus according to claim 1, wherein the first gain adjuster includes a plurality of amplification sections each having one or more amplifiers, and
   each of the plurality of amplification sections performs amplification when the first control voltage has a predetermined magnitude which differs between each of the plurality of amplification sections, and does not perform amplification when the first control voltage has a magnitude other than the predetermined magnitude.

3. The transmission apparatus according to claim 1, wherein the first control voltage is switched between a first magnitude and a second magnitude,
   the first gain adjuster includes:
      a first amplification section of receiving a supply of the first control voltage, and performing amplification when the first control voltage has the first magnitude and not performing amplification when the first control voltage has the second magnitude; and
      a second amplification section of receiving a supply of the first control voltage and a third control voltage maintained at a constant magnitude, and performing amplification when the first control voltage has the second magnitude and not performing amplification when the first control voltage has the first magnitude,
      wherein the first amplification section and the second amplification section each include one or more amplifiers.

4. The transmission apparatus according to claim 3, wherein the one or more amplifiers included in the first and second amplification sections each include a bipolar transistor,
   a base voltage of the bipolar transistor included in the first amplification section is determined, depending on the first control voltage, and
   a base voltage of the bipolar transistor included in the second amplification section is determined, depending on the first control voltage and the third control voltage.

5. The transmission apparatus according to claim 4, wherein by switching the first control voltage from the first magnitude to the second magnitude, the base voltage of the bipolar transistor included in the first amplification section is switched from a value of no less than an operational threshold thereof to a value of less than the operational threshold, and the base voltage of the bipolar transistor included in the second amplification section is switched from a value of less than an operational threshold thereof to a value of no less than the operational threshold.

6. The transmission apparatus according to claim 4, wherein the bipolar transistors included in the first and second amplification sections are formed on the same semiconductor substrate in the same manufacturing process.

7. The transmission apparatus according to claim 3, comprising a voltage adjusting circuit of changing the first control voltage supplied to the second amplification section, depending on the magnitude thereof, and supplying the resultant first control voltage to an amplifier included in the second amplification section.

8. The transmission apparatus according to claim 7, wherein the voltage adjusting circuit includes a bipolar transistor of operating when the first control voltage has a predetermined magnitude and not operating when the first control voltage has a magnitude other than the predetermined magnitude.

9. The transmission apparatus according to claim 1, wherein the second gain adjuster includes a variable resistance section of changing a resistance, depending on the first and second control voltages.

10. The transmission apparatus according to claim 9, wherein the variable resistance section has one or more field effect transistors, and a potential difference between a gate and a source of the field effect transistor is determined, depending on the first and second control voltages.

11. The transmission apparatus according to claim 10, wherein the variable resistance section includes a voltage divider of dividing the first control voltage and supplying the resultant divided voltage to the field effect transistor.

12. The transmission apparatus according to claim 3, wherein the second magnitude of the first control voltage is zero.

13. A mobile telephone terminal apparatus comprising a transmission section of continuously adjusting a magnitude of a transmission output level by changing a combination of gains of a plurality of gain adjusters, the transmission section comprising:
  a first one of the plurality of gain adjusters of receiving a supply of a first control voltage and discontinuously changing the gain thereof, depending on the first control voltage which is discontinuously changed; and
  a second one of the plurality of gain adjusters connected in series to the first gain adjuster, of receiving a supply of the first control voltage and a second control voltage and continuously changing the gain thereof, depending on the second control voltage which is continuously changed,
  wherein a sum of gain change amounts of the first and second gain adjusters due to the discontinuous change in the first control voltage is substantially zero when the second control voltage is constantly maintained at a predetermined magnitude.

* * * * *

UNITED STATES PATENT AND TRADEMARK OFFICE
CERTIFICATE OF CORRECTION

| | |
|---|---|
| PATENT NO. | : 7,421,255 B2 |
| APPLICATION NO. | : 11/188865 |
| DATED | : September 2, 2008 |
| INVENTOR(S) | : Masahiko Inamori et al. |

It is certified that error appears in the above-identified patent and that said Letters Patent is hereby corrected as shown below:

On the title page, Item "(30) Foreign Application Priority Data", change "Sep. 12, 2004    (JP)...............................2004-357267" to --December 9, 2004 (JP)....................... 2004-357267--.

Signed and Sealed this

Twentieth Day of January, 2009

JON W. DUDAS
*Director of the United States Patent and Trademark Office*